United States Patent [19]

Bales

[11] Patent Number: 4,568,878

[45] Date of Patent: Feb. 4, 1986

[54] SPECTRUM ANALYZERS

[75] Inventor: Robert W. Bales, Portland, Oreg.

[73] Assignee: Tektronix, Inc., Beaverton, Oreg.

[21] Appl. No.: 590,943

[22] Filed: Mar. 19, 1984

[51] Int. Cl.[4] ............................................. G01R 23/16
[52] U.S. Cl. .................................. 324/77 B; 364/485; 324/79 R
[58] Field of Search ................ 324/76 R, 77 R, 77 A, 324/77 B, 79 R, 79 D; 364/484, 485; 455/226

[56] References Cited

U.S. PATENT DOCUMENTS

| | | | |
|---|---|---|---|
| 3,634,760 | 1/1972 | Murtin | 364/485 |
| 3,876,946 | 4/1975 | LaClair et al. | 364/485 |
| 3,913,013 | 10/1975 | Barley | 324/77 B |
| 3,978,403 | 8/1976 | Mansfield | 324/77 B |
| 3,984,770 | 10/1976 | Chu | 364/484 |
| 3,992,666 | 11/1976 | Edwards | 324/77 B |
| 4,317,206 | 2/1982 | Nossen | 364/485 |

*Primary Examiner*—Michael J. Tokar
*Attorney, Agent, or Firm*—John Smith-Hill

[57] ABSTRACT

Spurious responses generated by operation of a spectrum analyzer are eliminated from the analyzer's display by selecting a feature of the displayed signal for testing, adjusting the analyzer controls to display the feature of interest at the center of the screen and with a predetermined span, adjusting the second L.O. frequency by a predetermined amount, and comparing the amplitude of the signal in the analyzer's storage location corresponding to a point on the screen at a predetermined position different from the center of the screen with the amplitude of the signal previously in the storage location corresponding to the center of the screen. If the comparison does not yield substantial equality, the selected feature is eliminated from the display.

2 Claims, 1 Drawing Figure

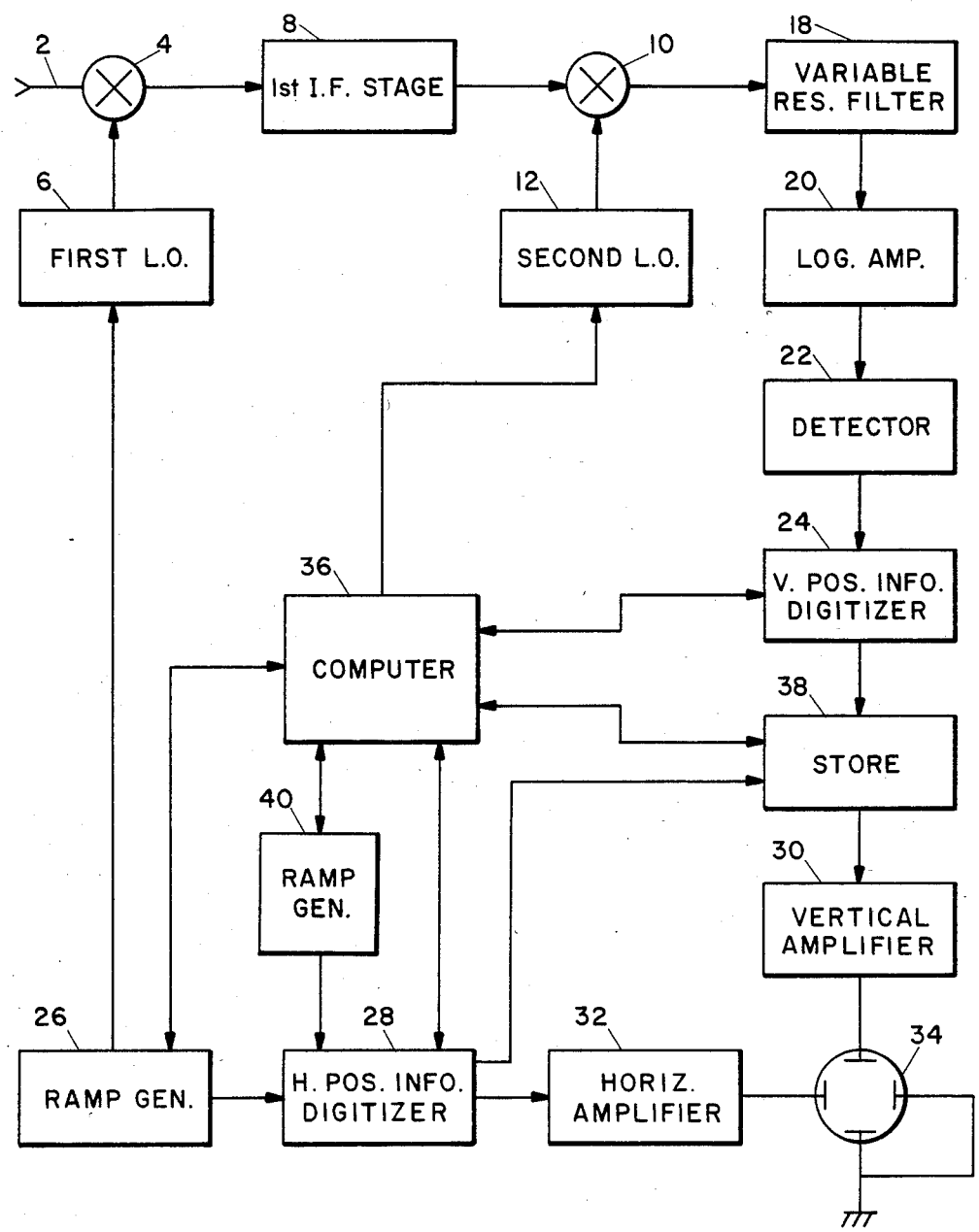

SPECTRUM ANALYZERS

This invention relates to spectrum analyzers and more particularly to automatic methods and means for eliminating from a spectrum analyzer's display spurious responses generated by operation of the spectrum analyzer.

BACKGROUND OF THE INVENTION

The most common type of spectrum analyzer is the superheterodyne or swept-frequency analyzer. The superheterodyne analyzer is based on the use of a mixer and a variable-frequency local oscillator. A simplified version of a conventional superheterodyne analyzer is shown in the single FIGURE of the drawing.

The input signal to be analyzed is received at an input terminal 2 and is mixed in a mixer 4 with the output signal at a frequency $f_{L1}$ of a sweeping local oscillator 6. The output signal of the mixer 4 is applied to an intermediate frequency filter stage 8, which includes a fixed-frequency band-pass filter, to produce an output signal at a frequency ($f_{IF1}$) in the pass band of the filter. A second mixer 10 and a local oscillator 12 have a fixed output frequency $f_{L2}$ are employed to provide an output frequency at a still lower frequency ($f_{IF2}$). The output signal from the second mixer 10 is fed to a second intermediate frequency filter and amplifier stage, including a fixed-frequency variable resolution filter 18 and a log amplifier 20. The output of the second IF stage is detected by a detector 22 and fed through amplifiers and video processing circuits (not shown) to a vertical information digitizing stage 24.

A ramp generator 26 generates a horizontal sweep ramp which is used to sweep the local oscillator 6 and it also applied to a horizontal information digitizing stage 28. Accordingly, the digital output of the digitizing stage 28 is representative of the instantaneous frequency of the local oscillator 10. A storage stage 38 is utilized for storing vertical information, representing signal amplitude, derived from the digitizing stage 24 at memory locations having addresses determined by the corresponding horizontal information, representing frequency, derived from the digitizing stage 28. A second ramp generator 40 generates a replica of the ramp generated by the horizontal sweep ramp generator 26, in timed relation therewith, and causes the digitizing stage 28 to generate a sequence of digital words and these words are used to drive the horizontal deflection amplifier 32 of a CRT 34 and to address a succession of memory locations in the storage stage 38. The vertical information stored in the addressed memory locations of the storage stage 38 drives the vertical deflection amplifier 30 of the CRT. Consequently, the CRT display represents variations in the power in the input signal (vertical axis) as a function of frequency (horizontal axis).

The operation of the analyzer is controlled by a computer 36. The computer may be constructed as an integral part of the analyzer, or it may be a controller which is separate from the analyzer proper, in which case the data to and from the analyzer would be sent over a data bus and distributed/collected by additional circuits in the analyzer. In the event that the computer is an integral part of the analyzer, it would interface to most sections of the analyzer and not just to those shown, namely the local oscillator 12, the ramp generators 26 and 40, the digitizing stages 24 and 28 and the storage stage 38. However, only the latter interfaces are shown, since they are the ones that are necessary in order to understand the invention.

A response with appear on the screen of the CRT whenever the input signal includes a component at a frequency $f_s$ such that one of the following conversion equations is satisfied:

$$(Mf_{L1} - Nf_s) - f_{L2} = f_{IF2} \tag{1}$$

$$(Nf_s - Mf_{L1}) - f_{L2} = f_{IF2} \tag{2}$$

$$(Nf_s + Mf_{L1}) - f_{L2} = f_{IF2} \tag{3}$$

$$f_{L2} - (Mf_{L1} - Nf_s) = f_{IF2} \tag{4}$$

$$f_{L2} - (Nf_s - Mf_{L1}) = f_{IF2} \tag{5}$$

$$f_{L2} - (Nf_s + Mf_{L1}) = f_{IF2} \tag{6}$$

An additional requirement is that the quantity in parenthesis be within the passband of the first IF filter stage 8. This frequency is selected such that either the first three or the last three conversions are not possible and is less than the minimum value of $f_{L1}$ so that conversions (3) and (6) are not possible. If only conversions (1) and (2) are possible and there is no input filter in the analyzer, the input signal levels are sufficiently low that harmonics of $f_s$ are not detected therefore N=1, a signal response will be produced for any input frequency $f_s$ which staisfies either of the following equations:

$$(Mf_{L1} - f_s) - f_{L2} = f_{IF2} \tag{1a}$$

$$(f_s - MF_{L1}) - f_{L2} = f_{IF2} \tag{2a}$$

However, the analyzer will be calibrated, on any band, for only one equation and a particular value of M (call it $M_1$). Nevertheless, operation of the analyzer results in the indication of spurious signals. Hitherto, the spurious signals have been identified by the operator of the analyzer.

Normally, the frequency $f_{L1}$ is swept so that higher frequencies appear on the display to the right of lower frequencies, with the display calibrated in frequency/division. Let the value be F. Then the frequency $f_{L1}$ sweeps $F/M_1$ for every division of beam movement on the CRT screen.

The identification procedure determines which of the responses on screen represent signals for which the analyzer is calibrated. Assume that the analyzer is calibrated for equation (1a). The frequency $f_{L2}$ is moved by an amount less than the first IF bandwidth. Assume that the frequency is lowered by 10 MHz with the analyzer set at 5 MHz/division. In order to get a response, the quantity in parenthesis must also be lowered by 10 MHz. If the signal is fulfilling equation (1a), $f_{L1}$ must be lowered by 10/M MHz. Thus, the response will appear $2 \times M_1/M$ divisions to the left of its former position. Only in the case of a signal for which the analyzer is calibrated (i.e., one for which $M = M_1$) will the shift be exactly two divisions. Other signals are spurious signals. If the signal is fulfilling equation (2a), the shift will be to the right instead of the left. Commonly, $f_{L2}$ is shifted on alternate sweeps and the shifted response is lowered in amplitude to permit easier visual identification.

SUMMARY OF THE INVENTION

The present invention enables the spurious signals to be identified automatically and eliminated from the display, removing the burden of locating spurious signals from the operator. In an embodiment of the invention, the computer is programmed to select a feature of the displayed signal for testing, adjust the analyzer controls to display the feature of interest at the center of the screen and with a predetermined span (Hz/division), adjust the second mixing frequency by a predetermined amount, compare the amplitude of the signal in the storage location corresponding to a point on the screen at a predetermined position different from the center of the screen with the amplitude of the signal previously (i.e., before the change in the second mixing frequency) in the storage location corresponding to the center of the screen, and, if the comparison does not yield substantial equality, eliminate the selected feature from the display. The "predetermined span" of the display is equal to the ratio of the "predetermined amount" by which the second mixing frequency is shifted to the difference (in divisions) between the center of the screen and the "predetermined position".

DETAILED DESCRIPTION

The invention may be performed using a spectrum analyzer having the conventional functional components shown in the drawing, but with the computer programmed to execute a novel algorithm. The general algorithm that is executed by the computer is:

1. Select a signal to be tested. The operator could select the signal and instruct the instrument to test the selected signal, or the computer could select a signal according to a predetermined criterion, for example: select largest signal; select all signals; select all signals over a given amplitude.

2. Set up for identification. The computer sets the analyzer controls to center on the signal of interest with the proper span, for example 5 MHz/division, and notes the address location in digital storage at which the signal maximum occurs.

3. Shift $f_{L2}$. The computer examines the digitized display resulting from the shift. If the signal is "genuine" (one for which the analyzer is calibrated), there will be a signal of the same amplitude in the digital storage location corresponding to the point on screen two divisions to the left (in the case of a 10 MHz reduction in $f_{L2}$) of the previous location. It is not necessary to reduce the amplitude of the shifted response when carrying out this step. A tolerance window on amplitude and position is provided.

4. Correct display. The computer returns the analyzer settings to those of step 1. If the signal selected is not "genuine", the computer writes back to the display, removing the display information in the area of the unwanted signal.

It will of course, be appreciated that the invention is not restricted to the particular method and apparatus which have been described and illustrated, since variations may be made therein without departing from the scope of the invention as defined in the appended claims, and equivalents thereof. It will also be appreciated that many details of modern, practical spectrum analyzers have not been discussed, since they are not necessary to an understanding of the invention. Furthermore, numerical values have been given only by way of example, to facilitate an understanding of the invention, and are not to be considered exhaustive or limiting on the scope of the invention.

I claim:

1. A method of analyzing the frequencies that are indicated to be present in an input signal, and of determining which of the indicated frequencies are in fact present in the input signal, comprising the following steps, not necessarily in the order stated:
   (1)
   (a) mixing the input signal with a first mixing signal varying in frequency in a predetermined fashion to produce a first mixed signal;
   (b) band-pass filtering said first mixed signal to provide a first filtered signal containing substantially only frequency components within a restricted pass band;
   (c) mixing the first filtered signal with a second mixing signal of constant frequency to produce a second mixed signal;
   (d) band-pass filtering said second mixed signal to provide a second filtered signal containing substantially only components of a pedetermined frequency;
   (e) detecting said second filtered signal to produce a detected signal representative of the variation of power in the input signal according to the variation in frequency of the varying frequency signal; and
   (f) digitizing said detected signal,
   (2)
   (a) generating a sweep signal of magnitude varying in accordance with the variation in frequency of the varying frequency signal; and
   (b) digitizing said sweep signal,
   (3) storing the digitized detected signal in a manner permitting correlation between the digitized detected signal and the digitized sweep signal,
   (4)
   (a) reading the stored detected signal in a manner correlated to the sweep signal;
   (b) utilizing the detected signal that has been read and its relation to the sweep signal to generate a display of the distribution of power in the input signal with respect to the frequency of the input signal; and
   (c) utilizing a digital computer to eliminate spurious portions of the displayed signal from the display by:
      (i) selecting a feature of the displayed signal for checking as to whether it is spurious;
      (ii) changing the frequency of the second mixing signal by a predetermined amount; and
      (iii) repeating steps (1)(a)-(f), (2)(a)-(b) and (3) while maintaining the second mixing signal at its changed frequency;
      (iv) comparing the digitized signal stored in step (4)(c)(iii) representing the power indicated in the input signal at the frequency of the selected feature of the displayed signal with the digitized signal stored in step (3) representing the power indicated in the input signal at the frequency of the selected feature of the displayed signal; and
      (v) if the comparison in step 4(c)(iv) does not yield substantial equality, eliminating said selected feature from the display.

2. A spectrum analysis apparatus for analyzing the frequencies that are indicated to be present in an input signal, and for determining which of the indicated frequencies are in fact present in the input signal, comprising:

(1)
- (a) a first local oscillator for generating a first mixing signal;
- (b) a first mixer for mixing the first mixing signal with the input signal to produce a first mixed signal;
- (c) a bandpass filter for filtering said first mixed signal to provide a first filtered signal containing substantially only frequency components within a restricted pass band;
- (d) a second local oscillator for generating a second mixing signal;
- (e) a second mixer for mixing the first filtered signal with the second mixing signal to produce a second mixed signal;
- (f) a second bandpass filter for filtering said second mixed signal to provide a second filtered signal containing substantially only frequency components within a relatively narrow pass band;
- (g) a detector for detecting said second filtered signal to produce a detected signal representative of the variation of power in the input signal in accordance with variation in frequency of the first mixing signal;
- (h) first digitizing means for digitizing the detected signal;

(2)
- (a) a sweep generator for generating a sweep signal varying in magnitude in accordance with the variation in frequency of the first mixing signal;
- (b) second digitizing means for digitizing said sweep signal;

(3) means for storing the digitized detected signal in a manner permitting correlation between the digitized detected signal and the digitized sweep signal, (4)
- (a) means for reading the stored detected signal in a manner correlated to the sweep signal;
- (b) display means for utilizing the detected signal that has been read and its relation to the sweep signal to generate a display of the distribution of power in the input signal with respect to the frequency of the input signal; and
- (c) a digital computer for eliminating spurious features from the display by:
  - (i) selecting a feature of the displayed waveform for checking as to whether it is spurious;
  - (ii) changing the frequency of the second mixing signal by a predetermined amount;
  - (iii) generating a detected signal and a corresponding sweep signal in response to the changed frequency of the second mixing;
  - (iv) comparing the detected signal produced in step (iii) and representing the power indicated in the input signal at the frequency of the selected feature of the displayed signal with the stored signal representing the power indicated in the input signal at the frequency of the selected feature of the displayed signal; and
  - (v) if the comparison does not yield substantial equality, eliminating said selected feature from the display.

* * * * *